US012675755B2

(12) United States Patent
Schürmann et al.

(10) Patent No.: US 12,675,755 B2
(45) Date of Patent: Jul. 7, 2026

(54) METHOD AND DEVICE FOR HIERARCHICALLY PLANNING EXECUTIONS OF OPERATION SEQUENCES ACHIEVING GOAL STATES OF TECHNICAL SYSTEM WORKFLOWS AND CHECKING THEM THROUGH SYSTEM SIMULATION OR SYSTEM HARDWARE EXECUTION

(71) Applicant: Siemens Aktiengesellschaft, Munich (DE)

(72) Inventors: Bastian Schürmann, Neufahrn bei Freising (DE); Sebastian Albrecht, Hallbergmoos (DE); Bernd Kast, Thannhausen (DE); Frederik Deroo, Hallbergmoos (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/919,868

(22) Filed: Oct. 18, 2024

(65) Prior Publication Data

US 2025/0139552 A1     May 1, 2025

(30) Foreign Application Priority Data

Oct. 31, 2023     (EP) .................................... 23207099

(51) Int. Cl.
*G06Q 10/0631*          (2023.01)
*G06F 30/20*          (2020.01)

(52) U.S. Cl.
CPC ....... *G06Q 10/06316* (2013.01); *G06F 30/20* (2020.01)

(58) Field of Classification Search
CPC ............. G06Q 10/063; G06Q 10/0631; G06Q 10/06316; G06Q 10/0633
See application file for complete search history.

(56) References Cited

U.S. PATENT DOCUMENTS 11,106,196 B2     8/2021   Feiten et al.
2019/0205792 A1*  7/2019   Huang .................. G06F 9/4881
(Continued)

FOREIGN PATENT DOCUMENTS

EP          3594767 A1 *  1/2020   ....... G05B 19/41885
EP          3446185 B1    8/2021
(Continued)

OTHER PUBLICATIONS

Chen, Heping, and Hongtai Cheng. "Online performance optimization for complex robotic assembly processes." Journal of Manufacturing Processes 72 (2021): 544-552. (Year: 2021).*

*Primary Examiner* — William S Brockington, III
(74) *Attorney, Agent, or Firm* — Schmeiser Olsen PLLC

(57)          ABSTRACT

A method and device for hierarchically planning executions of operation sequences achieving goal states of technical system workflows and checking them through system simulation or system hardware execution is provided. To hierarchically plan executions of operation sequences achieving goal states of technical system workflows and checking them, it is proposed to implement a goal-state-specifying-process, wherein <1> for a workflow of a technical system a workflow related planning domain is given, <2> a workflow related goal state is specified, <3> a planning task is defined, and <4> by a planning approach <4a> executions of the at least one selected planning operator are checked iteratively in order to find a full plan, and <4b> when in <4a> the full plan is found, the executions of the found full plan achieving the goal state are checked iteratively by a secondary query loop until the goal state is achieved.

11 Claims, 3 Drawing Sheets

(56)  References Cited

U.S. PATENT DOCUMENTS

| | | | |
|---|---|---|---|
| 2021/0149655 A1* | 5/2021 | Mathews | G06F 8/60 |
| 2021/0200560 A1* | 7/2021 | Munteanu | G06N 3/08 |
| 2022/0164279 A1* | 5/2022 | Stocker | G06F 11/3676 |
| 2022/0246246 A1* | 8/2022 | Arrechea | G06F 30/27 |
| 2023/0342430 A1* | 10/2023 | Pallikonda | G06N 20/00 |
| 2023/0418249 A1 | 12/2023 | Albrecht et al. | |

FOREIGN PATENT DOCUMENTS

| | | | |
|---|---|---|---|
| EP | 3978202 A1 | 4/2022 | |
| WO | 2018121904 A1 | 7/2018 | |
| WO | 2020025103 A1 | 2/2020 | |

\* cited by examiner

| FIG 2A | FIG 2B |
|--------|--------|

METHOD AND DEVICE FOR HIERARCHICALLY PLANNING EXECUTIONS OF OPERATION SEQUENCES ACHIEVING GOAL STATES OF TECHNICAL SYSTEM WORKFLOWS AND CHECKING THEM THROUGH SYSTEM SIMULATION OR SYSTEM HARDWARE EXECUTION

CROSS-REFERENCE TO RELATED APPLICATIONS

This application claims priority to EP Application No. 23207099.5, having a filing date of Oct. 31, 2023, the entire contents of which are hereby incorporated by reference.

FIELD OF TECHNOLOGY

The following refers to a method for hierarchically planning executions of operation sequences achieving goal states of technical system workflows and checking them through system simulation or system hardware execution and a device for hierarchically planning executions of operation sequences achieving goal states of technical system workflows and checking them through system simulation or system hardware execution.

BACKGROUND

Technical systems such as robotic systems contain components for flexible or even autonomous production, which depend on automatic ordering of production steps known as orchestration. When the technical or robotic system include for instance robots doing manipulations the task of orchestrating the automatic ordering of production steps can neither be solved solely on a symbolic level nor solely on a sub-symbolic, i.e., continuous level.

For instance, continuous properties of these robot manipulators like poses, torques, geometries are important to assure that the movements are feasible on the technical or robotic systems. On the other hand, sequences of tasks such as grasping or assembling change the configuration of the product and/or the technical or robotic system and thus can only be efficiently captured on a symbolic level for planning.

The more flexible technical system workflows have to be, the more these two aspects become intertwined. Thus, for full flexibility the planning approaches must consider both aspects in a combined manner which results in complex planning tasks.

This complexity can be reduced by a hierarchical planning, which is described in the following published patent documents EP 3 446 185 B1, WO 2018/121904 A1, WO 2020/025103 A1 und EP 3 978 202 A1.

So, the hierarchical planning can compute such sequences of tasks even for parallel processes and replanning due to plan deviations if they are obtained by measurements. Hierarchies focus on specific aspects while omitting others and thereby the hierarchies of the planning are used in the context of reducing the complexity to trade possibly optimality for feasibility. However, specifying tasks for any planner that then can be executed on real hardware is an error-prone process.

This is difficult since one goal object can be described on various levels of abstractions. So, the user has to find the right level, because a too-detailed model might impose too many restrictions on the overall task, i.e., unnecessarily restricting the degrees of freedom for the planner, thus the execution might become suboptimal or even infeasible, and a too-abstract model might result in undesired end configurations, e.g., wrong location of a goal product.

Moreover, an unexperienced user can easily define the goal in a wrong way which can lead to bad execution performance or the planner to not being able to find a solution which matches a corresponding goal state. In both cases the set of possible solutions is unnecessarily smaller than desired and a user support might help to identify them. In the latter case a solution would exist if the user had specified the desired goal correctly. This can even be the case that a solution exists, if the goal would represent what the user wants but did not correctly specify due to lack of support.

The general hierarchical planning approach is rather new and there exists so far, no interfaces usable by non-expert users.

A goal in this context is an instance of a so-called concept. From a programming perspective, each concept can correspond here to a class in a suitable programming language such as Python or C++. Then a goal is an instance of this class.

The planner reaches that goal if an instance of that class is reached during planning that has attributes matching all the attributes specified in the goal. It should be noted in this context that the planning instance might have more attributes as the goal but never has less. It is possible to specify tolerances when checking the match of attributes, which is especially important for floating point type attributes.

The goal is currently described by defining it manually in a text file. To do so, the user must fill the different attributes of the desired instance at the desired abstraction level. This approach is feasible on an expert level but lacks any intuition and is time-consuming due to the missing graphical support.

In classical automation an engineer would program a whole sequence of an automation workflow manually. So, while they do not have to specify a goal, they must script the whole workflow by hand.

Consequently, the manually engineered programs lack the flexibility of the planning approach with regard to changes in the setup, the product and production orders.

SUMMARY

An aspect relates to a method and device for hierarchically planning executions of operation sequences achieving goal states of technical system workflows and checking them through system simulation or hardware execution, by which allowed ranges of goal states are specified precisely and less error prone before starting the actual hierarchical planning.

The idea of embodiments of the invention is to implement a goal-state-specifying-process for hierarchically planning executions of operation sequences achieving goal states of technical system workflows and checking them through system simulation or hardware execution, wherein <1> for a workflow of a technical system a workflow related planning domain is given by deploying workflow related facts, which are based on a digital twin and a workflow related set of planning operators (Remark: An operator is a realization of a task which can be used for planning and/or execution will be defined in more detail further below), <2> a workflow related goal state, which comprises or consists of a set of desired goal instances, is specified by graphical-user-interface-based inputs of the goal-state-specifying-process given by consecutive steps, (i) a first step, in which a user chooses, in particular by using a 3D editor, each time in doing so respectively one different initial goal state, wherein the chosen different initial goal state is one of the graphical-user-interface-based inputs, (ii) a second step, in which a list with a finite, depending on the chosen initial goal state number "$m_{GSi}$" with $m_{GSi} \in N$ of different goal state abstraction levels is generated, and (iii) a third step, in which the user selects from the generated list, each time in doing so respectively one different "$j_{GSi}$"-th with $j_{GSi} \in \{1_{GSi}, \ldots, m_{GSi}\}$ goal state abstraction level of the number "$m_{GSi}$" of different goal state abstraction levels, wherein the selected different goal state abstraction level is one of the graphical-user-interface-based inputs, <3 > a planning task is defined for the specified goal state and according to the deployed planning domain based on the facts and for at least one selected planning operator of the workflow related set of planning operators, and <4> by a planning approach according to the defined planning task <4a> executions of the at least one selected planning operator are checked iteratively in order to find a full plan comprising first operation sequences to achieve the goal state by a primary query loop until the full plan achieving the goal state is found or an error of the technical system workflow is reached, and <4b> when in <4a> the full plan is found, the executions of the found full plan achieving the goal state are checked iteratively by a secondary query loop until the goal state is achieved.

So in more detail, according to the primary query loop of the planning approach in consecutive loop iterations (1) the at least one selected planning operator is executed, (2) primary control commands due to the at least one executed selected planning operator are generated, (3) the primary control commands to simulate the technical system workflow are accordingly applied and (4) the system simulation through primary measurement results of measurements are accordingly checked until the full plan achieving the goal state is found or the error of the technical system workflow is reached.

Further in more detail, according to the secondary query loop of the planning approach in which in consecutive loop iterations (1) the full plan is executed, (2) secondary control commands due to the executed full plan are generated, (3) the secondary control commands are accordingly applied to simulate or to execute in hardware the technical system workflow and (4) the system simulation or system hardware execution through secondary measurement results of measurements are accordingly checked until the goal state is achieved.

In the case that the error of the technical system workflow is reached the goal-state-specifying-process for hierarchically planning the executions of operation sequences achieving the goal states of the technical system workflows is stopped or cancelled. But there are also other measures feasible such as to continue with hierarchically planning the executions of operation sequences achieving the goal states of the technical system workflows.

Specifying goals or goal states manually without the mentioned goal-state-specifying-process, which is graphical-user-interface-based, is cumbersome and requires a certain level of expertise. It often happens that a user does not correctly specify the goal or the goal state. By having visual feedback due to the graphical-user-interface-based process it is easy to handle and reduces sources of goal specification errors.

Furthermore, by using existing information from a 3D editor in combination of models from the planning domain allows to simplify this process and ensures that the user selects the goals or goal states exactly at the desired levels so that they can be processed. This ensures a better planning performance, fewer iterations in specifying the goals or goal states, and less engineering overhead in general.

So, the 3D editor is used to describe scenes for various tasks. Some can be used to specify goals for planning tasks, e.g., motion planning. All these planners plan only on a single level of abstraction and therefore, the goals are specified explicitly on that level of abstraction.

It is advantageous that the workflow related goal state specified by the graphical-user-interface-based inputs of the goal-state-specifying-process is given after the third step by further consecutive steps, (iv) a fourth step, in which different feasible goal states of the selected different goal state abstraction level are sampled and presented to the user, and (v) a fifth step, in which the user is interrogated whether all the sampled, presented goal states are feasible, and if the presented goal states are feasible, the chosen different initial goal state and the selected different goal state abstraction level are both the graphical-user-interface-based inputs otherwise if the presented goal states are not feasible either ("Option I") the third step is carried out for another selected different goal state abstraction level or ("Option II") the first step is carried out for another chosen different initial goal state.

So, it is beneficial that one or more planning operators of the at least one selected planning operator are selectable several times for checking the executions iteratively in order to find the full plan comprising the first operation sequences. This is beneficial, because in many applications multiple execution of certain operators are required.

In addition, embodiments of the invention can be used when the technical system is a robotic system.

Finally, it is beneficial that the technical system workflow is outputted via a data logger of the technical system.

This has the advantage that it allows us to store the resulting workflow for offline use.

In the case of the robotic system and the corresponding workflows there can be discrete manufacturing with robot arms, wherein controls are, e.g., torques, joint values or reference trajectories, etc.

In the case of the technical system and the corresponding workflows there can be an orchestration of continuous processes, e.g., chemical, biological, etc., and routing of liquid, gaseous product flows, wherein controls are, e.g., temperature of a heater, rotational velocity of a mixer, status of a valve etc.

In the case of the technical system and the corresponding workflows there can be an autonomous lab assistant, e.g., machine tending, handling of materials, etc., for instance in the pharma domain, wherein controls are a combination of the two use cases above.

In the case of the technical system there can be a flexible adaptation of workflows depending on machine availability, process times and/or current demands in factories, wherein controls are, e.g., starting times for machines, identifiers (IDs) and types of components or elements to be processed, etc.

In the case of the robotic or technical system and the corresponding workflows there can be a task allocation for a fleet of "Automated Guided Vehicles <AGVs>" including additional tasks such as anomaly detection, wherein controls are, e.g., locations to be reached, object identifiers (IDs) to be transported, starting times, reference trajectories, etc.

In the context of embodiments of the invention with the used terms the following well-known term explanations are given:

I. An operator is an instruction that maps a list of input instances to output instances. This instruction can be realized, for example, by programming logical conditions, evaluating a simulation or reading sensor data. For the hierarchical planning as a special case of general planning the operators can also be structured hierarchically—this means a coarser operator uses input and yields output instances that correspond to more abstract concepts than those of more detailed operators.

II. A concept is a structure specifying a list of attributes that themselves are concepts or base types. This corresponds to a class in object-oriented programming. Depending on the chosen attributes for each concept, a software automatically computes a hierarchy which is analogue to an inheritance structure in programming.

III. An instance is a realization of such a concept. It specifies for each attribute a value of a given base type, or an instance of the concept specified for the attribute. This recursive definition results in tree-structures full of base type values representing a fact. This corresponds to an instance in object-orient programming.

IV. A fact is an instance that is assumed to be a part of a current state. The facts are either directly specified by a user or imported from sensors or databases.

V. A goal is an instance that describes fully or partially a desired goal state of the technical system workflow—this is a partially ordered set of operators. A representation of such a set is a precedence graph where a directed edge goes from one node to the other if one operator (represented by a first node) has to be successfully finished before the other operator (represented by the second node) can start. The goal state is specified by the user.

A planning task is a combination of facts describing a start configuration, the goal state specifying what has to be accomplished, and operators (e.g., hierarchical) capturing all actions that can be done.

VI. A planning approach (e.g., hierarchical) is a software that searches for an at least partially ordered set of operators as known as a plan or workplan that transforms the facts as initial instances into the goal state. The set of operators is a precedence graph capturing which operator has to be successfully executed before some other is started.

The planning approach can run in an offline mode where the plan is a dedicated output that then can be used by an execution engine to control the actual hardware. But it can also run in an online mode where the execution is a most detailed planning level such that the hardware is controlled adaptively. This means the planning approach iteratively generates plans on all levels of the hierarchy, but the most detailed plan is already the execution level on the hardware. This means that a successful planning on the most detailed level corresponds to a successful execution of the task on the hardware.

VII. An execution engine executes a plan on the hardware.

The scenario on the basis of the goal-state-specifying-process as an important part of embodiments of the invention can be sketched in principle as follows:

By using the desired 3D editor and on the basis of a world model of the technical system and the corresponding work-flows, a scene is created, which in the context is assumed as a given entity. This scene describes all physical properties and the geometric relations. During execution it can be seen as a digital twin of the of the technical system and the corresponding workflows.

The idea behind the goal-state-specifying-process is now to use this existing 3D representation to enable an intuitive goal specification, since it allows to specify possible configurations of goal objects.

The goal-state-specifying-process provides a concept structure with all attributes available, wherein the task in goal state specification is now to choose the right selection of these attributes, i.e., by using a sufficient combination.

This will then result in a data structure required by the hierarchical planning and the planning task.

To choose these attributes, the user can select and deselect attributes of the object created by the goal-state-specifying-process and in particular by using the 3D editor.

One further aspect of the goal-state-specifying-process is to display the set of instances that match to the current selected set of attributes. The fewer attributes are selected, the more configurations fulfill the requirements of the goal.

These object sets or a sampled version of them are then computed to be displayed to the user.

The 3D environment lets the user easily check whether all displayed objects would be acceptable as goals.

If the set is too large, the user needs to select additional required properties.

If the set is too small, the user must deselect some of the currently required properties.

When a suitable set is displayed, the user can generate the goal state description in a data format suitable for the hierarchical planning and the planning task.

Based on the specified goal state, the planning executions of operation sequences achieving goal state of technical system workflow and checking them through system simulation or system hardware execution are computed which leads to the abstracted goal and sends the corresponding control inputs to the system simulation or system hardware.

Example of a goal scene: The goal state is to have a specific product, e.g., a box with a lid on the box, in a certain working area. So, it is only important that the lid is on the top, the exact position or orientation are not required. In a 3D world editor, the user puts the product on the table inside the working area. The 3D editor has now exact information about the pose of the object.

However, if the object just must be on that table, the user can allow for many more configurations than the currently displayed pose.

The user can relax the actual values in x- and y-direction and only stick to the z-value otherwise the object would hoover above the table or be stuck into it.

Then the visualization would show multiple translated objects on that table, i.e. a sampled version of the full set.

However, the orientation of the object might also be free.

If the user now removes the attribute of the rotation about the z-axis from the goal description, the instances now cannot only be spread all about the table, but also, they can be rotated.

This again is visualized in a sampled manner in the 3D environment.

The sketched scenario has the following procedural structure:

A planning domain describing facts and operators.

A selection of these elements describes together with goals a planning task to be solved.

The planning domain as component can be realized via an additional "Graphical User Interface <GUI>", or a text editor.

The planning domain is also part of the hierarchical planning.

A planning approach gets a planning task from the planning domain component and tries to find a plan that transforms initial instances (facts) into desired instances (goals).

The planning approach is also part of the hierarchical planning.

If a full plan is found, it can be forwarded to an execution engine.

\# The "Graphical User Interface <GUI>" combines as described above besides the two elements, a 3D world model editor to model the goal scene and a goal selection part, where the goal is shown in different levels of abstraction by three additional elements, a visualization of the hierarchy of the plan, selection menus for operators, and a visualization, e.g., 3D visualization.

By selecting the desired abstraction levels of the goal state according to the goal-state-specifying-process, the goal for the hierarchical planning is automatically specified.

By selecting an interesting plan step and some operators a step-by-step call of the operators can be realized and executed via the execution engine.

The execution engine is also part of the scenario.

The execution engine triggers the calls of the operators.

The operators are executed either in software or hardware depending on the level of abstraction and the implementation of the operator.

An execution result, e.g., joint trajectories, is then sent to the visualization component of the "Graphical User Interface <GUI>".

Fixing the task specification and general setup is not directly part of embodiments of the invention being disclosed by the present application, but it closes the loop and can be part of the planning domain with the GUI.

BRIEF DESCRIPTION

Some of the embodiments will be described in detail, with reference to the following figures, wherein like designations denote like members, wherein:

FIG. 1 a device for hierarchically planning executions of operation sequences achieving a goal state of a workflow of a technical system and checking them through system simulation or hardware execution;

DETAILED DESCRIPTION

Figure 1:
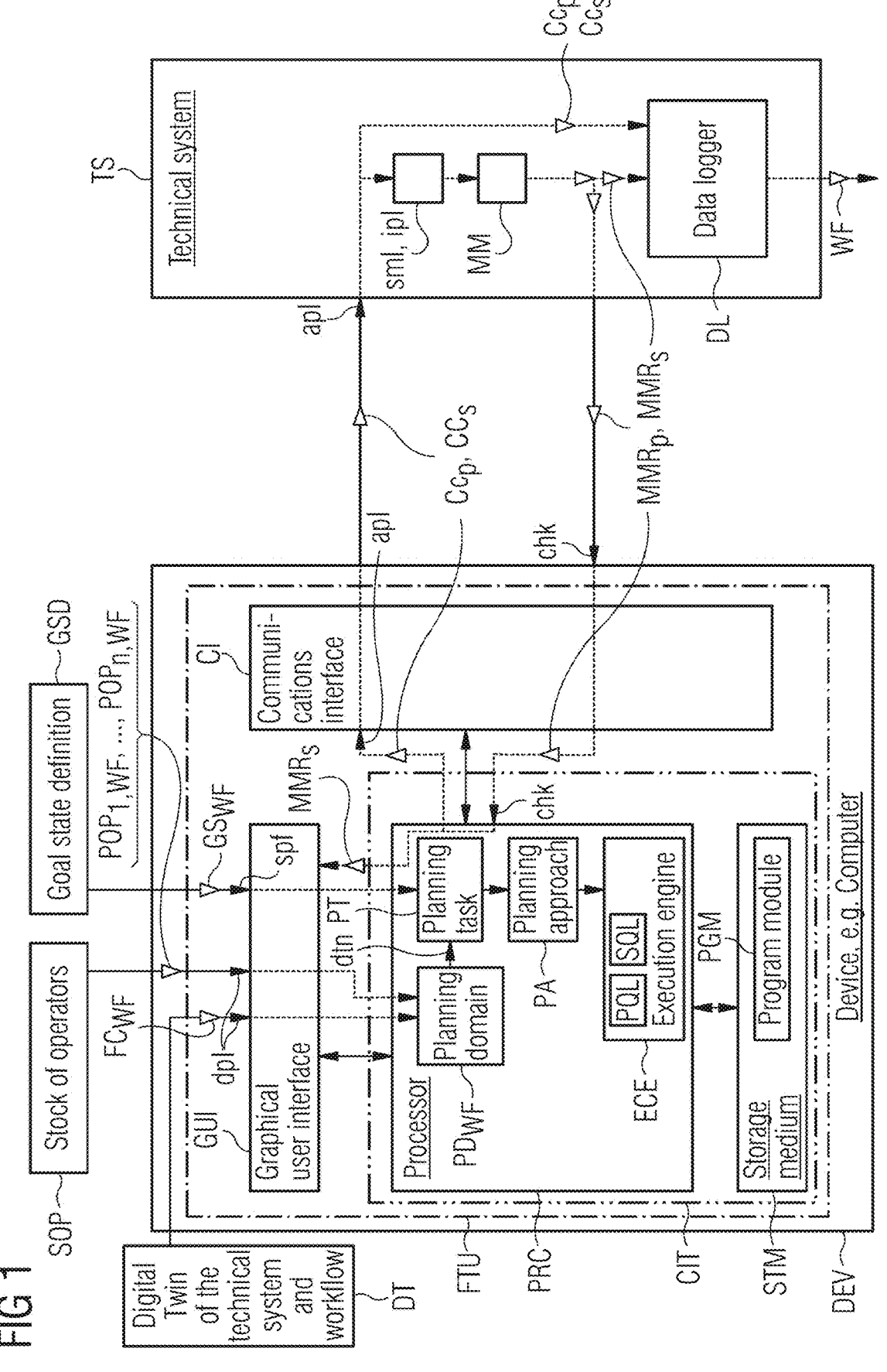

FIG. 1 shows a device DEV for hierarchically planning executions of operation sequences achieving a goal state $GS_{WF}$ of a workflow WF of a technical system TS, which is for example a robotic system, and wherein the executions of the operation sequences achieving the goal state $GS_{WF}$ are checked through system simulation or hardware execution.

For this purpose, the device DEV includes a processor PRC, a graphical user interface GUI, a communications interface CI and a non-transitory, processor-readable storage medium STM having processor-readable program-instructions of a program module PGM for hierarchically planning and checking the executions of the operation sequences, which is stored in the non-transitory, processor-readable storage medium STM.

While the two interfaces GUI, CI are connected to the processor PRC, the processor PRC executing the processor-readable program-instructions of the program module PGM forms on one hand with the non-transitory, processor-readable storage medium STM including the processor-readable program-instructions of the program module PGM a computer-implemented tool CIT for hierarchically planning the executions of the operation sequences achieving the goal state $GS_{WF}$ of the workflow WF of the technical system TS which then are checked through system simulation or hardware execution and on the other with the graphical user interface GUI, the communications interface CI and the non-transitory, processor-readable storage medium STM with the processor-readable program-instructions of the program module PGM a functional unit FTU for hierarchically planning the executions of the operation sequences achieving the goal state $GS_{WF}$ of the workflow WF of the technical system TS which then are checked through system simulation or hardware execution.

The computer-implemented tool CIT is a computer-program-product, which is for instance designed as an application software, called as APP, and loadable into the device DEV, so that it can be executed by the processor PRC.

The so formed functional unit FTU is designed in such a way that the goal state $GS_{WF}$ of the considered technical system workflow WF is specified spf according to a goal state definition GSD and inputted via the graphical user interface GUI into the processor PRC of the device DEV and the technical system workflow WF is based on a workflow related planning domain $PD_{WF}$, which is part of the processor PRC executing the processor-readable program-instructions of the program module PGM for planning and checking the executions of the operation sequences.

Figures 2, 2A:
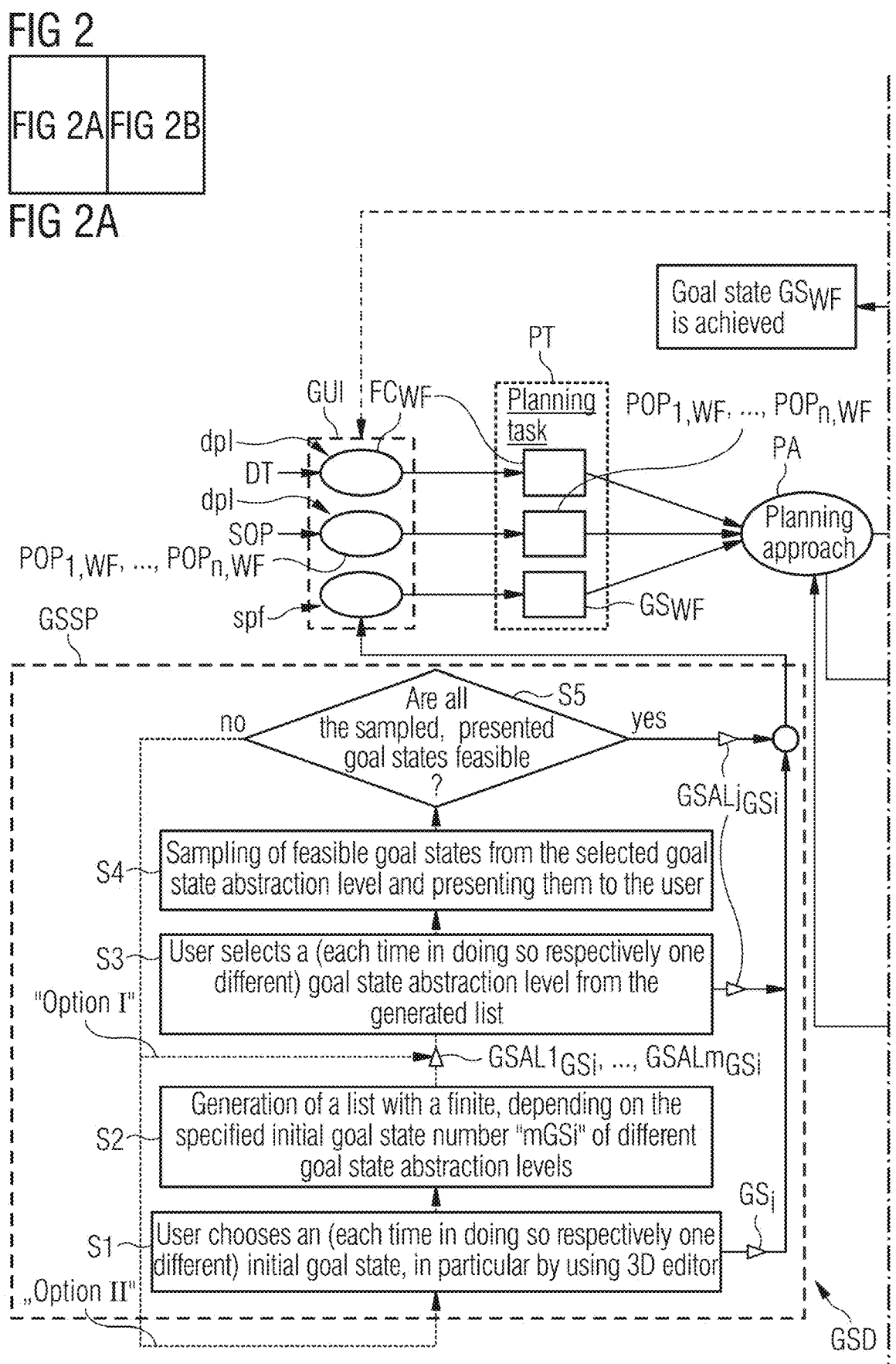
FIG. 2 is divided into FIGS. 2A and 2B.
FIG. 2A is a first part of the functionality and way of working of a functional unit implemented in the device according to the FIG. 1.

How the goal state definition GSD is done by a user using the device DEV for hierarchically planning the executions of the operation sequences achieving the goal state $GS_{WF}$ the workflow WF of the technical system TS and checking them through system simulation or hardware execution and how according to this goal state definition GSD the goal state $GS_{WF}$ of the considered technical system workflow WF is specified spf will be explained in detail below when FIG. 2 is described.

The planning domain $PD_{WF}$ is given by a stock of operators SOP, which contains a workflow related set of planning operators $POP_{1,WF}, \ldots, POP_{n,WF}$. The workflow related set of planning operators $POP_{1,WF}, \ldots, POP_{n,WF}$ are deployed dpl and inputted via the graphical user interface GUI into the processor PRC of the device DEV. This deployment is also normally and done by the user using the device DEV for hierarchically planning the executions of the operation sequences achieving the goal state $GS_{WF}$ the workflow WF of the technical system TS and checking them through system simulation or hardware execution.

Moreover, the planning domain $PD_{WF}$ is given by a digital twin DT, e.g., a 3D representation, of the technical system TS, which contains workflow related facts $FC_{WF}$. The workflow related facts $FC_{WF}$ are also deployed dpl and also input via the graphical user interface GUI into the processor PRC of the device DEV. This deployment is also normally and done by the user.

Also part of the processor PRC executing the processor-readable program-instructions of the program module PGM for hierarchically planning and checking the executions of the operation sequences is a planning task PT, which is defined dfn for the specified goal state $GS_{WF}$ and according to the deployed planning domain $PD_{WF}$ based on the facts $FC_{WF}$ and for at least one selected planning operator of the workflow related set of planning operators $POP_{1,WF}, \ldots, POP_{n,WF}$.

Figure 2B:
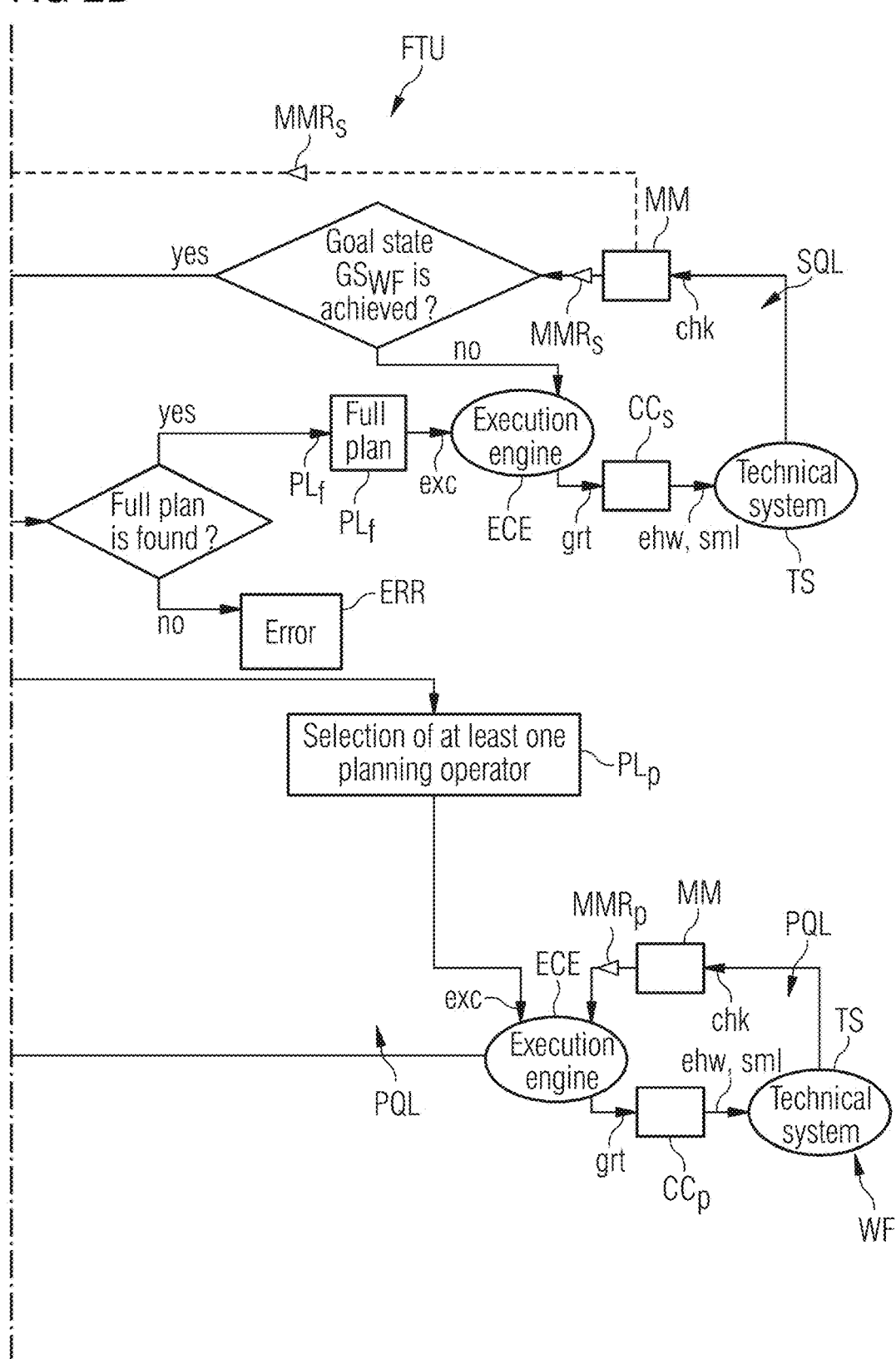
FIG. 2B is a second part of the functionality and way of working of a functional unit implemented in the device according to the FIG. 1.

Furthermore, part of the processor PRC executing the processor-readable program-instructions of the program module PGM for hierarchically planning and checking the executions of the operation sequences are a planning approach PA according to the defined planning task PT and an execution engine ECE. The functionality of these parts in the context of hierarchically planning the executions of the operation sequences achieving the goal state $GS_{WF}$ of the technical system workflow WF and checking them through system simulation or hardware execution will be described now together with respect to FIG. 2, which is divided into FIG. 2A and FIG. 2B shows the functionality and way of working of the functional unit FTU implemented in the device DEV according to the FIG. 1.

In order to define dfn the planning task PT the goal state $GS_{WF}$—as mentioned above—has to be specified spf according to the goal state definition GSD. For this purpose the goal state definition GSD is carried out by a goal-state-specifying-process GSSP as depicted in FIG. 2 which is divided into FIG. 2A and FIG. 2B. According to this goal-state-specifying-process GSSP the workflow related goal state $GS_{WF}$ inputted via the graphical user interface GUI is specified spf by graphical-user-interface-based inputs. Thereby the goal-state-specifying-process GSSP is given by consecutive steps, (i) a first step S1, in which a user chooses, by using a 3D editor, an initial goal state $GS_i$, wherein the chosen, initial goal state $GS_i$ is one of the graphical-user-interface-based inputs, (ii) a second step S2, in which a list with a finite, depending on the chosen initial goal state $GS_i$ number "$m_{GSi}$" with $m_{GSi} \in N$ of different goal state abstraction levels $GSAL1_{GSi}, \ldots, GSALm_{GSi}$ is generated, and (iii) a third step S3, in which the user selects from the generated list a "$j_{GSi}$"-th with $j_{GSi} \in \{1_{GSi}, \ldots, m_{GSi}\}$ goal state abstraction level $GSALj_{GSi}$ of the number "$m_{GSi}$" of different goal state abstraction levels $GSAL1_{GSi}, \ldots, GSALm_{GSi}$, wherein the selected goal state abstraction level $GSALj_{GSi}$ is one of the graphical-user-interface-based inputs.

However if the user is not sure whether the selected goal state abstraction level $GSALj_{GSi}$ is feasible it is possible according to desired development of the embodiment given by the steps S1 to S3 that for specifying the workflow related goal state $GS_{WF}$ by the graphical-user-interface-based inputs the goal-state-specifying-process GSSP is extendable. So the extended goal-state-specifying-process GSSP is given after the third step S3 by further consecutive steps, (iv) a fourth step S4, in which different feasible goal states of the selected different goal state abstraction level $GSALj_{GSi}$ are sampled and presented to the user, and (v) a fifth step S5, in which the user is interrogated accordingly whether all the sampled, presented goal states are feasible, and if the presented goal states are feasible, the chosen initial goal state $G_i$ and the selected goal state abstraction level $GSALj_{GSi}$ are both the graphical-user-interface-based inputs.

If however in the case that not all the presented goal states are feasible, according to an "Option I" it is going back from the fifth step S5 to the third step S3 and each time in doing so respectively the third step S3 is carried out for the selection of another, one different (compared to the previously selected one or the previously selected ones) "$j_{GSi}$"-th with $j_{GSi} \in \{1_{GSi}, \ldots, m_{GSi}\}$ goal state abstraction level $GSALj_{GSi}$ of the number "$m_{GSi}$" of different goal state abstraction levels $GSAL1_{GSi}, \ldots, GSALm_{GSi}$, wherein the selected different goal state abstraction level $GSALj_{GSi}$ is one of the graphical-user-interface-based inputs.

If however in the case that the presented goal states are not feasible, alternatively according to an "Option II" it is going back from the fifth step S5 to the first step S1 and each time in doing so respectively the first step S1 is carried out for the choosing of another, one different (compared to the previously chosen one or the previously chosen ones) initial goal state $G_i$, wherein the chosen different initial goal state $GS_i$ is one of the graphical-user-interface-based inputs.

So, when accordingly the planning task PT is defined dfn for the at least one selected planning operator of the workflow related set of planning operators $POP_{1,WF}, \ldots, POP_{n,WF}$, the following steps take place in the context of planning the executions of the operation sequences achieving the goal state $GS_{WF}$ of the technical system workflow WF and checking them through system simulation or hardware execution:

A. Executions of the selected planning operator are checked iteratively in order to find a full plan $PL_f$ comprising first operation sequences OPS1 achieving the goal state $GS_{WF}$ by a primary query loop PQL. The primary query loop PQL is run through in consecutive loop iterations until the full plan $PL_f$ achieving the goal state $GS_{WF}$ is found or an error ERR of the technical system workflow (WF) is reached by (1) executing exc the at least one selected planning operator through the execution engine ECE, (2) generating grt primary control commands $CC_p$ due to the at least one executed selected planning operator through the execution engine ECE, (3) accordingly applying apl the primary control commands $CC_p$ outputted via the communications interface CI to simulate sml the technical system workflow WF and (4) accordingly checking chk the system simulation through primary measurement results $MMR_p$ of measurements MM, which are fed back to the execution engine ECE.

In the case that the error of the technical system workflow is reached the goal-state-specifying-process for hierarchically planning the executions of operation sequences achieving the goal states of the technical system workflows is stopped or cancelled.

In the context of the step A, it is also possible that one or more planning operators of the at least one selected planning operator are selectable several times for checking the executions iteratively in order to find the full plan $PL_f$ comprising the first operation sequences OPS1.

B. When in step A, the full plan $PL_f$ is found, the executions of the found full plan $PL_f$ achieving the goal state $GS_{WF}$ are checked iteratively by a secondary query loop SQL. The secondary query loop SQL is run through in consecutive loop iterations until the goal state $GS_{WF}$ is achieved by (1) executing exc the full plan $PL_f$ through the execution engine ECE, (2) generating grt secondary control commands $CC_s$ due to the executed full plan $PL_f$ through the execution engine ECE, (3) accordingly applying apl the secondary control commands $CC_s$ outputted via the communications interface CI to simulate sml or to execute in hardware ehw the technical system workflow WF and (4) accordingly checking chk the system simulation or hardware execution through secondary measurement results $MMR_s$ of measurements MM, which are fed back to the execution engine ECE.

As an option it is possible that the secondary measurement results $MMR_s$ are fed back to the graphical user interface GUI for outputting them for the user for control purposes.

In the technical system TS there is a data logger DL, which logs the control commands $CC_p$, $CC_s$ and the measurements results MMRp, MMRs. Due to this logging of the cited data the workflow WF of the technical system TS is characterized and can be outputted, e.g., for a user on a display or for storing into a file.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for hierarchically planning executions of operation sequences achieving goal states of technical system workflows and checking the executions of operation sequences achieving goal states through hardware execution, wherein the method comprises:
   a) for a technical system workflow of a technical system, wherein the technical system is a robotic system having robotic arms and is configured to perform physical actions, a workflow related planning domain is given by deploying graphical-user-interface-based inputs comprising workflow related facts, wherein the workflow related facts are based on both a digital twin and a workflow related set of planning operators, and wherein the digital twin is a 3 dimensional (3D) representation of the technical system,
   b) specifying a workflow related goal state by the graphical-user-interface-based inputs of a goal-state-specifying-process given by consecutive steps,
   b1) a first step of receiving a choice from a user using a 3D editor, each time in doing so respectively of one different initial goal state, wherein the one different initial goal state is one of the graphical-user-interface-based inputs,
   b2) a second step of generating a list depending on a chosen initial goal state number "mGsi" with mesi being chosen from a number of different goal state abstraction levels, and
   b3) a third step of receiving a user selection from the generated list of one different goal state abstraction level of the mesi different goal state abstraction levels, wherein the selected one different goal state abstraction level is one of the graphical-user-interface-based inputs,
   c) defining a planning task, which is a combination of facts, for the specified workflow related goal state and according to the workflow related planning domain based on the facts and for at least one selected planning operator of the workflow related set of planning operators, wherein each planning operator of the at least one selected planning operator is a task capturing physical actions of the technical system workflow, and
   d) by a planning approach according to the defined planning task
   d1) checking executions of the at least one selected planning operator iteratively in order to find a full plan comprising first operation sequences to achieve a goal state of the goal states by a primary query loop, wherein in consecutive loop iterations until, by <i> executing in hardware the at least one selected planning operator, <ii> generating primary control commands due to the at least one executed selected planning operator, <iii> accordingly applying the primary control commands to simulate the technical system workflow and <iv> accordingly checking system simulation through primary measurement results of measurements, the full plan achieving the goal state is found, and
   d2) checking executions of the full plan achieving the goal state iteratively by a secondary query loop, wherein in consecutive loop iterations until by <i> executing the full plan, <ii> generating secondary control commands due to the full plan, <iii> performing, by applying the secondary control commands, a hardware execution of the technical system workflow and <iv> accordingly checking the hardware execution of the technical system workflow through secondary measurement results of measurements, the goal state is achieved.

2. The method according to claim 1, wherein the workflow related goal state specified by the graphical-user-interface-based inputs of the goal-state-specifying-process is given after the third step by further consecutive steps,
   b4) a fourth step of sampling different goal states of selected different goal state abstraction levels and presenting the sampled different goal states to the user as presented goal states, and
   b5) a fifth step of interrogating the user whether all the presented goal states are feasible, and if all the presented goal states are feasible then the different initial goal state and the selected different goal state abstraction levels are both the graphical-user-interface-based inputs; otherwise if all the presented goal states are not feasible either ("Option I") the third step is carried out for another selected different goal state abstraction level or ("Option II") the first step is carried out for another chosen different initial goal state.

3. The method according to claim 1, wherein one or more planning operators of the at least one selected planning operator are selectable for checking the executions of the at least one selected planning operator iteratively in order to find the full plan comprising the first operation sequences.

4. The method according to claim 1, said method further comprising outputting the technical system workflow via a data logger of the technical system.

5. The method according to claim 1, wherein the physical actions of the robotic system include one or more physical actions selected from the group consisting of torques, motions, and graspings.

6. A computer-implemented tool, a computer-program-product, configured as an application software, called as APP, for hierarchically planning executions of operation sequences achieving goal states of technical system workflows and checking the executions of operation sequences achieving goal states through hardware execution with
   a non-transitory, processor-readable storage medium having processor-readable program-instructions of a program module for planning and checking the executions of the operation sequences, which is stored in the non-transitory, processor-readable storage medium, and
   a processor connected with the non-transitory, processor-readable storage medium executing the processor-readable program-instructions of the program module to carry out the method according to claim 1.

7. A device for hierarchically planning executions of operation sequences achieving goal states of technical system workflows and checking the executions of operation sequences achieving goal states through system simulation or hardware execution, with a processor, a graphical user interface and a communications interface each connected to the processor and a non-transitory, processor-readable storage medium having processor-readable program-instructions of a program module for planning and checking the executions of the operation sequences, which is stored in the non-transitory, processor-readable storage medium, wherein the processor executing the processor-readable program-instructions of the program module, the graphical user interface, the communications interface and the non-transitory, processor-readable storage medium with the processor-readable program-instructions of the program module form a functional unit which is configured to perform a method that comprises:

a) for a technical system workflow of a technical system wherein the technical system is a robotic system having robotic arms and is configured to perform physical actions, a workflow related planning domain is given by deploying graphical-user-interface-based inputs comprising workflow related facts, wherein the workflow related facts are based on both a digital twin and a workflow related set of planning operators, and wherein the digital twin is a 3 dimensional (3D) representation of the technical system, b) specifying a workflow related goal state inputted via the graphical user interface by the graphical-user-interface-based inputs of a goal-state-specifying-process given by consecutive steps, b1) a first step of receiving a choice from a user using a 3D editor, each time in doing so respectively of one different initial goal state, wherein the one different initial goal state is one of the graphical-user-interface-based inputs, b2) a second step of generating a list depending on a chosen initial goal state number "mesi" with mesi being chosen from a number of different goal state abstraction levels, and b3) a third step of receiving a user selection from the generated list of one different goal state abstraction level of the mesi different goal state abstraction levels, wherein the selected one different goal state abstraction level is one of the graphical-user-interface-based inputs, c) defining a planning task, which is a combination of facts, for the specified workflow related goal state and according to the workflow related planning domain based on the facts and for at least one selected planning operator of the workflow related set of planning operators, wherein each planning operator of the at least one selected planning operator is a task capturing physical actions of the technical system workflow, and d) by a planning approach according to the defined planning task and an execution engine d1) checking executions of the selected planning operator iteratively in order to find a full plan comprising first operation sequences achieving a goal state of the goal states by a primary query loop, wherein in consecutive loop iterations until, by <i> executing in hardware the at least one selected planning operator, <ii> generating primary control commands due to the at least one executed selected planning operator through the execution engine, <iii> accordingly applying the primary control commands outputted via the communications interface to simulate the technical system workflow and <iv> accordingly checking system simulation through primary measurement results of measurements fed back to the execution engine, the full plan achieving the goal state is found, and d2) checking executions of the full plan achieving the goal state iteratively by a secondary query loop, wherein in consecutive loop iterations until by <i> executing the full plan through the execution engine, <ii> generating secondary control commands due to the full plan through the execution engine, <iii> performing, by applying the secondary control commands outputted via the communications interface, a hardware execution of the technical system workflow and <iv> accordingly checking the hardware execution of the technical system workflow through secondary measurement results of measurements, the goal state is achieved.

8. The device according to claim 7, wherein the workflow related goal state specified by the graphical-user-interface-based inputs of the goal-state-specifying-process is given after the third step by further consecutive steps, b4) a fourth step of sampling different goal states of selected different goal state abstraction levels and presenting the sampled different goal states to the user as presented goal states, and b5) a fifth step of interrogating the user whether all the presented goal states are feasible, and if all the presented goal states are feasible then the different initial goal state and the selected different goal state abstraction levels are both the graphical-user-interface-based inputs; otherwise if all the presented goal states are not feasible either ("Option I") the third step is carried out for another selected different goal state abstraction level or ("Option II") the first step is carried out for another chosen different initial goal state.

9. The device according to claim 7, wherein one or more planning operators of the at least one selected planning operator are selectable for checking the executions of the at least one selected planning operator iteratively in order to find the full plan comprising the first operation sequences.

10. The device according to claim 7, wherein a computer into which a computer implemented tool is loadable.

11. The device according to claim 7, wherein the physical actions of the robotic system include one or more physical actions selected from the group consisting of torques, motions, and graspings.

* * * * *